United States Patent
Tuominen et al.

(10) Patent No.: US 7,851,019 B2
(45) Date of Patent: Dec. 14, 2010

(54) METHOD FOR CONTROLLING THE SUBLIMATION OF REACTANTS

(75) Inventors: Marko Tuominen, Helsinki (FI); Eric Shero, Phoenix, AZ (US); Mohith Verghese, Phoenix, AZ (US)

(73) Assignee: ASM International N.V., Bilthovenm (NL)

( * ) Notice: Subject to any disclaimer, the term of this patent is extended or adjusted under 35 U.S.C. 154(b) by 80 days.

(21) Appl. No.: 12/170,801

(22) Filed: Jul. 10, 2008

(65) Prior Publication Data

US 2008/0274276 A1 Nov. 6, 2008

Related U.S. Application Data

(62) Division of application No. 10/463,309, filed on Jun. 16, 2003, now Pat. No. 7,601,225.

(60) Provisional application No. 60/389,528, filed on Jun. 17, 2002.

(51) Int. Cl.
*C23C 16/00* (2006.01)

(52) U.S. Cl. .............. 427/255.23; 427/248.1; 118/726; 118/727; 392/342; 392/386; 392/388; 422/243

(58) Field of Classification Search ............. 392/388
See application file for complete search history.

(56) References Cited

U.S. PATENT DOCUMENTS

| | | | |
|---|---|---|---|
| 2,447,789 A * | 8/1948 | Barr ............................ 219/422 |
| 3,569,672 A * | 3/1971 | Hurko ...................... 219/465.1 |
| 4,314,128 A | 2/1982 | Chitre |
| 4,548,138 A | 10/1985 | Korenberg |
| 4,883,362 A | 11/1989 | Gartner et al. |
| 4,947,790 A | 8/1990 | Gartner et al. |
| 5,084,089 A | 1/1992 | Zekely et al. |
| 5,551,278 A | 9/1996 | Rounbehler et al. |
| 5,553,395 A | 9/1996 | Wen et al. |
| 5,674,574 A | 10/1997 | Atwell et al. |
| 5,698,037 A | 12/1997 | Stauffer |
| 5,862,605 A | 1/1999 | Horie et al. |
| 5,904,771 A | 5/1999 | Tasaki et al. |
| 5,989,305 A | 11/1999 | Ohsaki et al. |
| 6,015,590 A * | 1/2000 | Suntola et al. ......... 427/255.23 |

(Continued)

FOREIGN PATENT DOCUMENTS

DE 33 39 625 C2 1/1991

(Continued)

OTHER PUBLICATIONS

Burykina et al (Powder Metallurgy and Metal Ceramics. vol. 4, No. 12 (1965). p. 991-995).*

(Continued)

*Primary Examiner*—Michael Cleveland
*Assistant Examiner*—Joel G Horning
(74) *Attorney, Agent, or Firm*—Knobbe Martens Olson & Bear LLP

(57) ABSTRACT

An apparatus and method improves heating of a solid precursor inside a sublimation vessel. In one embodiment, inert, thermally conductive elements are interspersed among units of solid precursor. For example the thermally conductive elements can comprise a powder, beads, rods, fibers, etc. In one arrangement, microwave energy can directly heat the thermally conductive elements.

19 Claims, 7 Drawing Sheets

U.S. PATENT DOCUMENTS

| | | | |
|---|---|---|---|
| 6,033,493 A | 3/2000 | Hertz et al. | |
| 6,120,640 A | 9/2000 | Shih et al. | |
| 6,132,492 A | 10/2000 | Hultquist et al. | |
| 6,178,925 B1 * | 1/2001 | Sturm et al. | 122/390 |
| 6,244,331 B1 * | 6/2001 | Budelman | 165/80.3 |
| 6,251,233 B1 | 6/2001 | Plester et al. | |
| 6,270,839 B1 | 8/2001 | Onoe et al. | |
| 6,325,017 B1 | 12/2001 | DeBoer et al. | |
| 6,720,259 B2 | 4/2004 | Londergan et al. | |
| 6,905,541 B2 | 6/2005 | Chen et al. | |
| 6,906,296 B2 | 6/2005 | Centanni et al. | |
| 7,186,385 B2 | 3/2007 | Ganguli et al. | |
| 7,270,709 B2 | 9/2007 | Chen et al. | |
| 2003/0053799 A1 | 3/2003 | Lei | |
| 2004/0016404 A1 | 1/2004 | Gregg et al. | |
| 2005/0039794 A1 | 2/2005 | Birtcher et al. | |

FOREIGN PATENT DOCUMENTS

| | | |
|---|---|---|
| GB | 2 151 662 A | 7/1985 |
| JP | 1-265511 | 10/1989 |
| JP | 08-299778 | 11/1996 |
| JP | 011 168 092 | 6/1999 |
| JP | 2002-359238 | 12/2002 |
| WO | WO 2007/057631 A2 | 5/2007 |

OTHER PUBLICATIONS

Smith, J.M., *Chemical Engineering Kinetics, 3rd Edition*, 1981, pp. 268-291, McGraw-Hill Book Company.

Smith, J.M., *Chemical Engineering Kinetics, 3rd Edition*, 1981, pp. 554-563, McGraw-Hill Book Company.

* cited by examiner

METHOD FOR CONTROLLING THE SUBLIMATION OF REACTANTS

REFERENCE TO RELATED APPLICATIONS

The present application is a divisional of Ser. No. 10/463,309, filed Jun. 16, 2003, now U.S. Pat. No. 7,601,225, issued on Oct. 13, 2009 and claims the priority benefit under 35 U.S.C. §119(e) of Provisional Application No. 60/389,528, filed on Jun. 17, 2002.

The present application is also related to U.S. Pat. No. 7,122,085, issued on Oct. 17, 2006, entitled "Sublimation Bed Employing Carrier Gas Guidance Structures," which claims priority from Provisional Application No. 60/400,210, filed Jul. 30, 2002.

FIELD OF THE INVENTION

The present invention is related to solid precursor sources used for the deposition of thin films on substrates. More specifically, the present invention is related to the enhancement of thermal conductivity to the solid precursor inside the precursor source apparatus.

BACKGROUND AND SUMMARY OF THE INVENTION

Quite often solid precursors are used for vapor reactants, because liquid or gaseous precursors for a certain element may not be readily available or do not exist at all. Such solid precursors are useful in a variety of contexts, including, without limitation, atomic layer deposition (ALD) and other semiconductor fabrication processes. However, it is more difficult to use solid precursors than liquid and gaseous precursors.

Basically, the handling of solid precursors seems to be straightforward. Solid precursor is loaded into a container that is heated to a sufficiently high temperature. The precursor sublimes and the precursor vapor is conducted to a reaction space where it is used for the deposition of thin film on the substrate surface.

Precursor powder generally has rather poor thermal conductivity. The thermal conductivity of the precursor bulk may be low and/or there may be empty voids between the precursor particles with little contact surface between the particles, which is undesirable for the conduction of heat energy through the precursor. The volume of the voids depends on the packing density of the precursor powder. At low pressures, heat transport by convection is also generally inefficient, especially when the precursor volume consists of very small voids between the precursor particles. Heat transport by radiation is also generally inefficient because the temperature differences are relatively small and the radiation view factor (line-of-sight paths available for radiant heating) for the bulk of the powder is essentially zero.

When the precursor vessel is heated from outside, the precursor may have a sufficiently high temperature near the vessel walls while the center parts of the precursor powder are insufficiently heated. This temperature differential results from the long period of time required to heat the centrally located portions of the precursor powder in the precursor vessel. In addition, sublimation of the non-centrally located precursor consumes thermal energy, further contributing to the center of the precursor powder volume remaining at a lower temperature than the powder proximate the vessel surfaces throughout the process. During ALD pulsing, this temperature differential can cause the solid source to demonstrate a poor recovery rate after using the precursor source for an extended period, because it becomes more and more difficult to reach an equilibrium state in the gas phase of the precursor vessel. Although ALD processes are relatively insensitive to small drifts in pulse concentration, significant decreases in the recovery rate can cause problems, such as less than full surface coverage of a semiconductor wafer (or other substrate) with the precursor molecules.

Temperature differences inside the precursor vessel lead to the sublimation of the precursor into the gas phase in hotter parts of the vessel volume and to the condensation of the precursor back to the solid phase in cooler parts of the vessel volume. Often the top surface of the precursor seems to be cooler than the rest of the precursor. It has been observed that a hard and dense crust forms over the surface of the heated precursor over time, causing a pulse concentration drift in the process employing the vapor reactant (e.g. ALD). The crust limits the diffusion of precursor molecules from the bulk material to the surface and eventually into the gas phase. The result is a decrease in the observed sublimation rate of the precursor. Initially, the solid precursor source works well but later it is difficult to get a high enough flux of precursor molecules from the source into the reaction chamber, despite the fact that a significant amount of solid precursor remains in the precursor vessel.

Another consideration in sublimation vessel design is that prolonged presence of heated corrosive precursors places heavy demands on those materials in contact with precursors in the precursor vessel.

The preferred embodiments of the invention provide means for improving the uniformity of the source temperature in the whole solid precursor vessel volume. In accordance with one aspect of the present invention, inert materials that have high thermal conductivity are mixed with the solid precursor to improve the thermal conductivity through the precursor. For example, the inert materials can comprise particles, fibers, rods, or other elements with high thermal conductivity distributed through the precursor vessel and intermixed with precursor powder.

In accordance with one embodiment of the invention, a method of producing a vapor from a solid precursor for processing a substrate is provided, including placing solid units of precursor into a vessel and interspersing a thermally conductive material through the precursor. The thermally conductive material thereby preferably serves to conduct heat energy throughout the units of precursor. A vapor is then formed through applying heat energy to both the thermally conductive material and the solid units of precursor. In one embodiment, after vapor formation, the vapor is routed from the vessel to a reaction chamber and reacted to deposit a layer on a substrate.

In accordance with another embodiment, a substrate processing system is provided for forming a vapor from a solid precursor by distributing heat throughout the precursor. The provided system comprises a heat conducting vessel configured to hold units of solid precursor, thermally conductive elements being interspersed with the units of solid precursor. A heater is also provided for heating both the precursor and the thermally conductive elements.

In accordance with yet another embodiment, a substrate processing system for forming a vapor from a solid precursor is provided. The system includes a vessel configured to hold units of solid precursor and a microwave generator adjacent to the vessel. The generator is configured to transmit heat energy in the form of microwave energy to effectuate the heating of the precursor.

In accordance with a further embodiment, a mixture for producing a vapor used in substrate processing is provided.

The mixture includes a batch of precursor for producing a substrate processing vapor and a plurality of heat transmitting solid forms interspersed through the batch of precursor. The plurality of heat transmitting solid forms collectively increase the thermal conductivity of the batch of precursor.

Advantageously, implementation of the preferred embodiments decreases crust formation at the precursor surface and enhances the sublimation of the precursor. In addition, improving sublimation rate uniformity over the operational life of the precursor batch decreases the amount of unused precursor. Refilling of the precursor vessel is also needed less often due to more efficient material utilization. Another benefit of the present invention is the improvement of the thin film thickness uniformity on substrates by processes employing vapor from the solid precursor by encouraging rapid recovery of the partial pressure of reactant in the gas phase of the vessel to a steady-state value (one such value is $P^0$, the saturation vapor pressure of the material) from pulse-to-pulse.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENTS

Figure 1A:
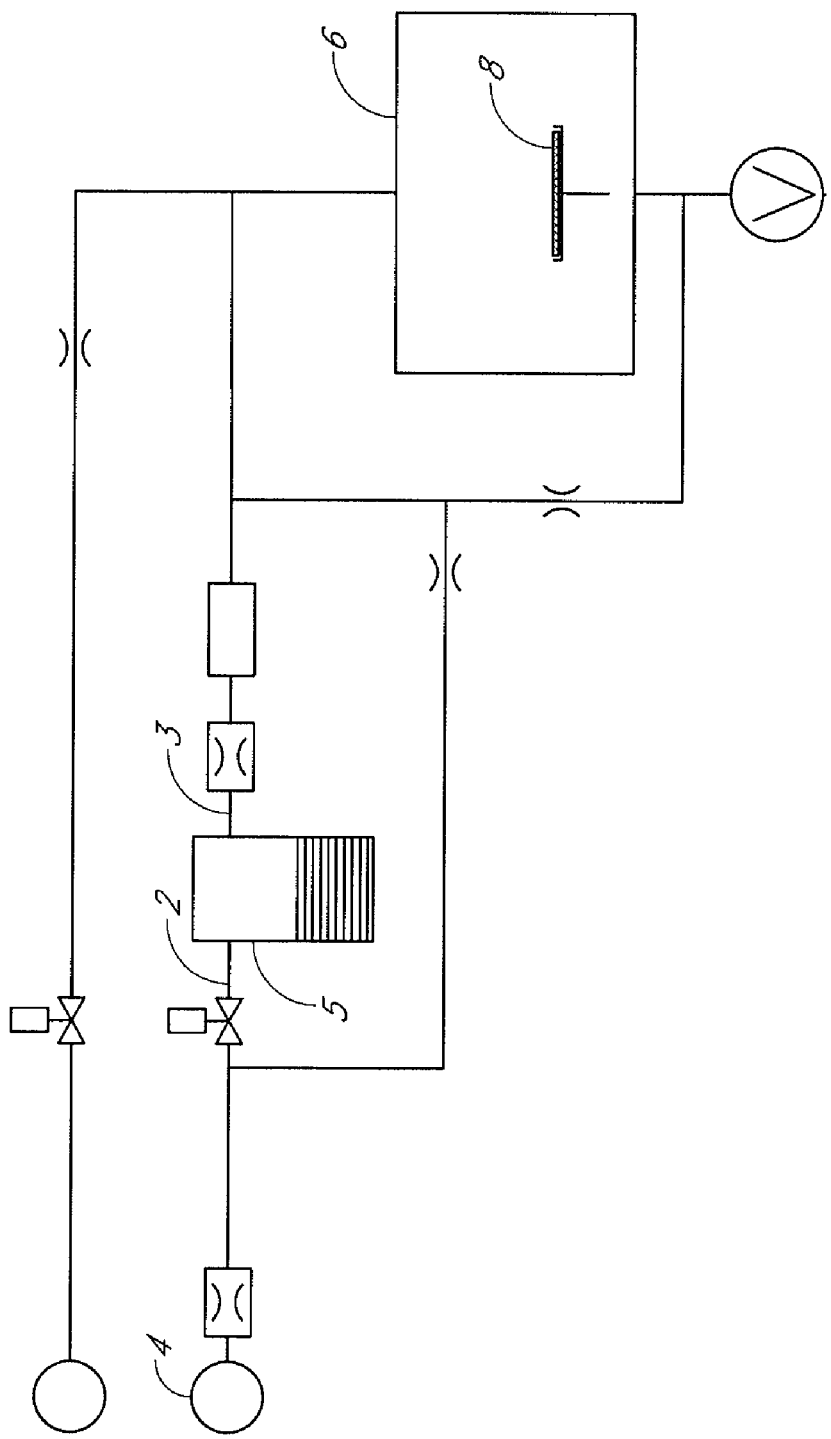
FIG. 1A is a schematic overview of a precursor source apparatus inline between a gas source and a reaction chamber.

Referring to FIG. 1A, a precursor source apparatus 5 is shown inline between a carrier gas source 4 and a reaction chamber 6 configured to accommodate a substrate 8.

Figure 1B:
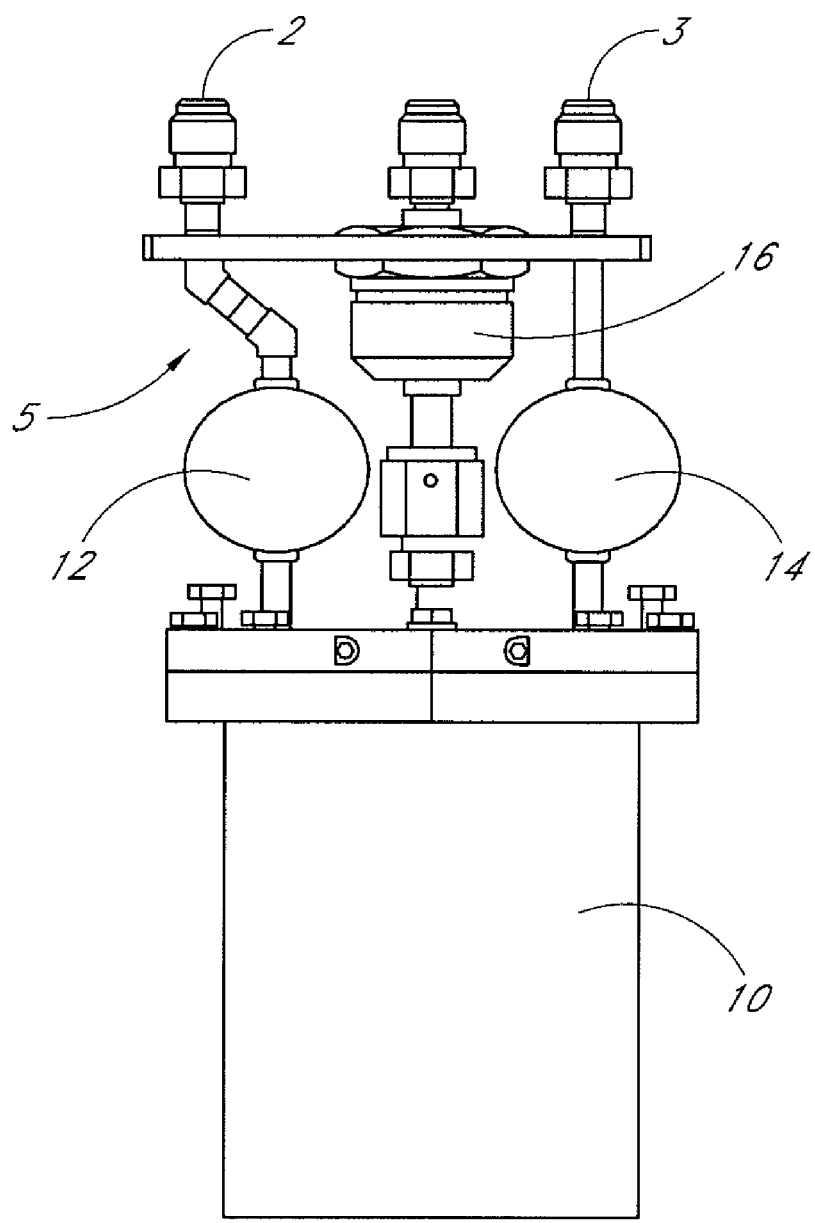
FIG. 1B is a schematic side view of the precursor source apparatus of FIG. 1A, constructed in accordance with a preferred embodiment.

FIG. 1B shows a preferred embodiment of the precursor source apparatus 5 for vaporizing a solid precursor, the resulting vapor to be employed in substrate processing, having a pressure chamber 10, an inlet 12, an outlet 14 and, preferably, an over-pressure relief valve 16. The inlet 12 is preferably attached to a carrier gas source 4 (FIG. 1A) via a first conduit 2, while the outlet 14 is preferably attached via a second conduit 3 to the reaction chamber 6 (FIG. 1A).

Figure 2:
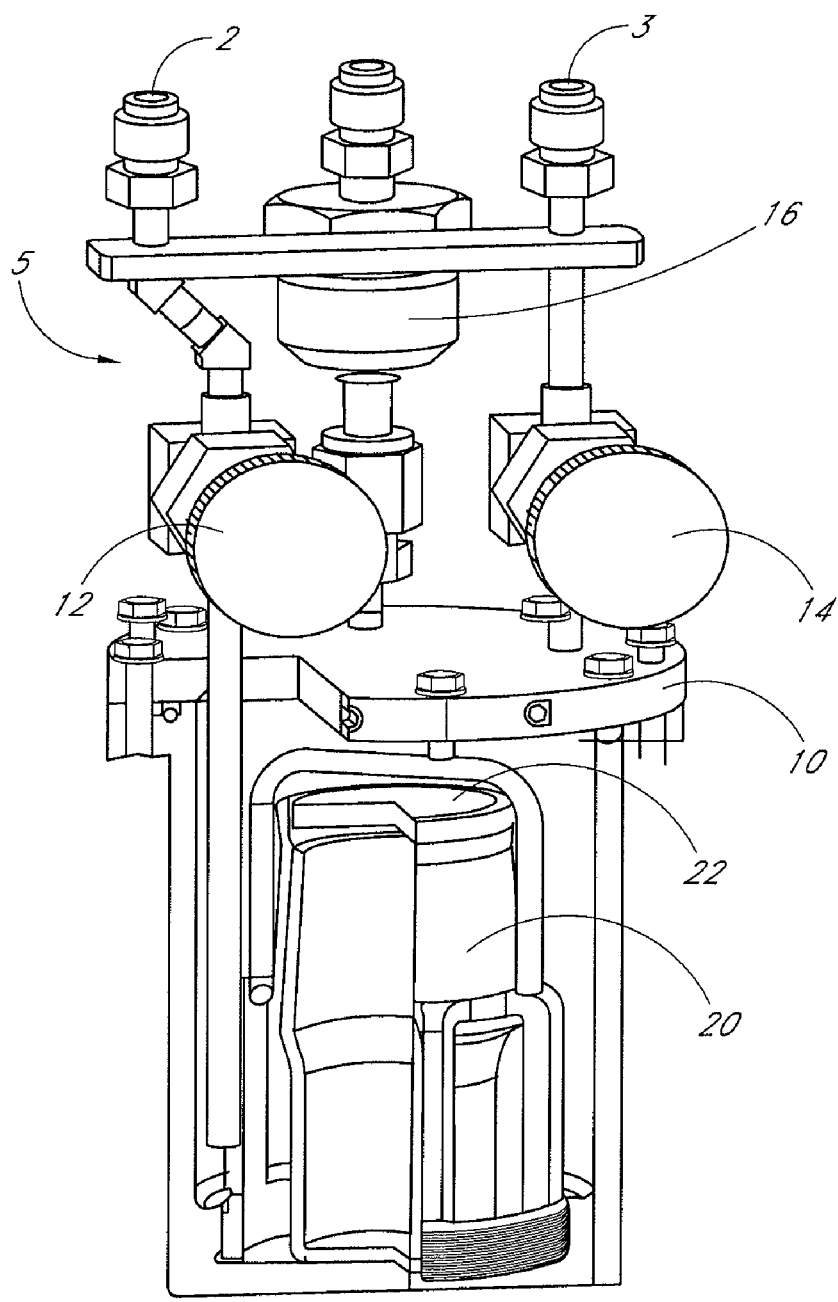
FIG. 2 is a schematic, partially cut-away perspective view of the precursor source apparatus of FIG. 1B, showing a precursor vessel inside a pressure chamber.

FIG. 2 is a schematic, partially cut-away, perspective view of the precursor source apparatus 5 of FIG. 1, showing an inner precursor vessel or crucible 20 inside the pressure chamber 10. The inner crucible 20 located inside the pressure chamber 10 is used as a precursor vessel. The shape and dimensions of the crucible 20 are selected depending on the volume available inside the temperature-controlled pressure chamber 10. The material of the crucible 20 can comprise inert substances, such as quartz glass or silicon carbide. In addition, a particle filter 22 is preferably located on top of the crucible 20. In an alternative embodiment, the particle filter is located on the vessel outlet 14 or second conduit 3. Porous crucible walls are employed in certain preferred embodiments, the walls of the crucible acting as particle filters as the precursor vapor diffuses through the walls.

Figure 3:
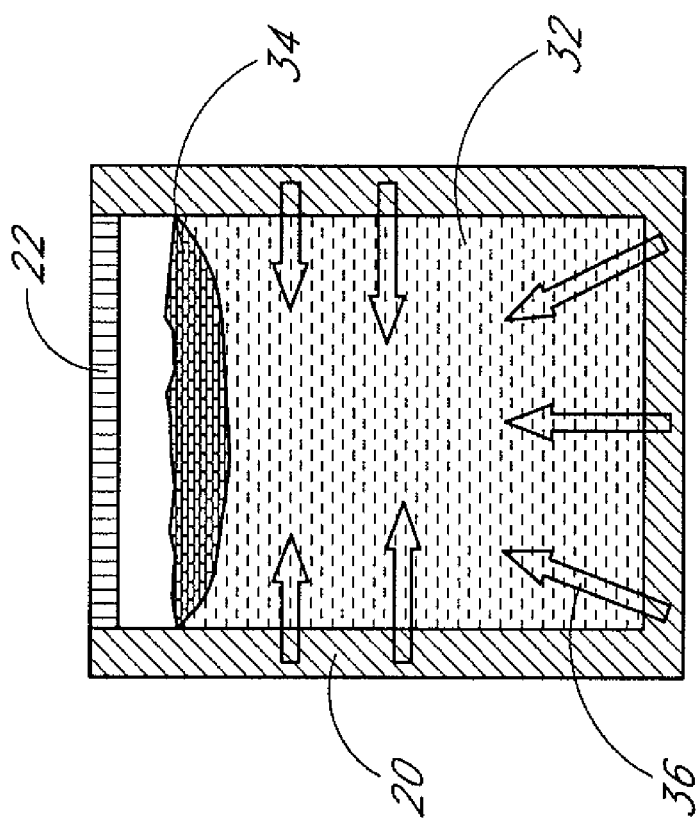
FIG. 3 is a schematic side view of a precursor vessel from the prior art with crust formation at the upper surface of a volume of solid precursor, with arrows showing the direction of heat flow.

FIG. 3 illustrates crust formation in the prior art, one of the problems that preferred embodiments of the present invention seek to address. FIG. 3 shows a schematic side view of the crucible 20 holding a volume of solid precursor 32. A crust 34 tends to form at the upper surface of the solid precursor 32, with arrows 36 in FIG. 3 showing the direction of travel of heat which is applied to the crucible 20.

Figure 4:
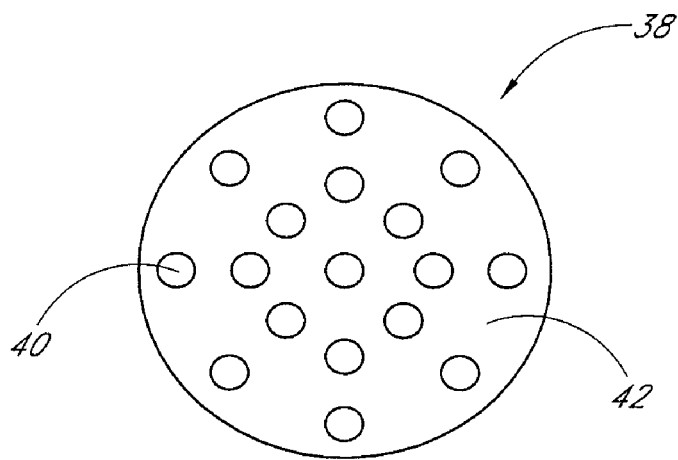
FIG. 4 is a schematic top view of a vessel insert with thermally conductive rods attached to a vessel base, constructed in accordance with a preferred embodiment.
Figure 5:
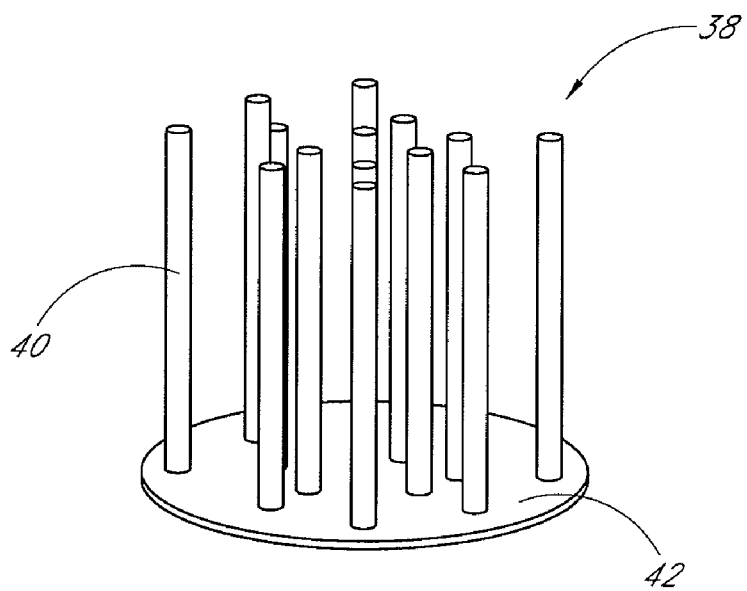
FIG. 5 is a schematic perspective view of the insert of FIG. 4.

FIGS. 4 and 5 show still another preferred embodiment of the present invention. An insert 38 is configured to fit within the crucible 20 (FIG. 2) or other vessel in which the solid precursor is to be held. The insert 38 is preferably selected to have good heat conductivity. The insert 38 includes heat conducting elements 40, here rods, which are machined and attached to a vessel base 42. Preferably, heat flows along primary axis of the elements 40, then radially outward into the material, resulting in the whole precursor volume being heated efficiently and uniformly. The elements 40 are preferably formed from, for example, SiC of the highest purity and quality, since the elements 40 can be cleaned and re-used. In another embodiment, the heat conducting elements are preferably made of the same material as the vessel, e.g., stainless steel. In the illustrated embodiment, the elements are formed from SiC-coated graphite, but in other embodiments the elements are uncoated. In yet other embodiments the elements are formed from heat conducting substances other than SiC and graphite.

In accordance with one preferred embodiment, the insert 38 of FIGS. 4 and 5 is machined and fitted into the precursor vessel 20. Precursor is then poured into the vessel 20. In accordance with another embodiment a precursor vessel 20 is first filled with precursor powder 32 and then elements 40, shown in FIGS. 4 and 5 as inert, heat-conducting rods, are pushed through the precursor 32 so that the lower ends of the rods 40 touch the bottom of the precursor vessel 20. In an alternate embodiment, the rods are attached to the base of the source container 10 and the source container 10 is filled with the precursor powder 32. In yet other arrangements, rods are each configured to be inserted independently of one another.

Preferably, the selected rod density is a function of the heat transfer properties of the solid (i.e. a solid which has poor heat transfer desirably is selected to have a higher density to lessen the heat transfer path).

In accordance with the embodiments shown in FIGS. 4 and 5, the rods 40 can be located on the bottom plate 42. Preferably the rods 40 are arranged, for example, in a polar coordinate type layout, so that each unit of the precursor 32 is located within a certain maximum distance from the rods 40 or the base plate 42. The number of vertical rods 40 attached to a plate depends on the physical properties of the precursor 32. More rods can be used if the heat transport through the precursor is very poor.

In yet other alternate embodiments the thermally conductive elements interspersed with the precursor units can be formed from fixed elements such as, for example, rods, stacked screens, sieves, coils, plates, etc. These units or elements can include both porous and nonporous structures. Preferably, these fixed units or elements are arranged so as to maximize the total amount of thermally conductive surfaces in contact with precursor, while allowing vapor diffusion from the carrier gas inlet to the outlet. Precursor preferably diffuses through the mixture of powder and thermally conductive elements. Preferably, the carrier gas convectively transports the chemical in the upper portion of the vessel (or head space) from the inlet to the outlet.

Figure 6:
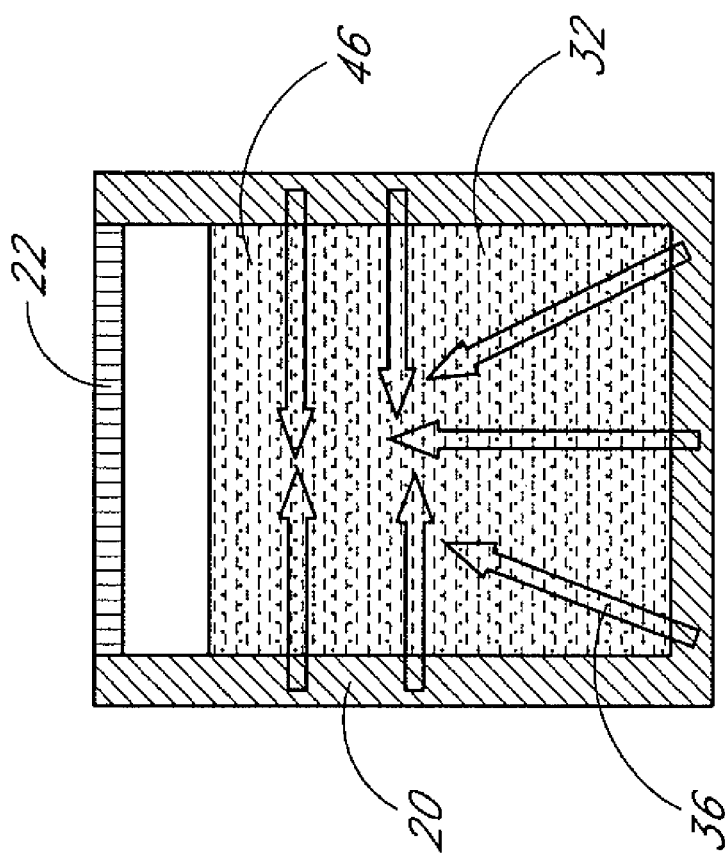
FIG. 6 is a schematic side view of a precursor source apparatus having thermally conductive units interspersed with the precursor, in accordance with a preferred embodiment.

FIG. 6 shows a preferred embodiment in which loose thermally conductive elements 46 are mixed with precursor powder 32 inside the crucible 20. In certain preferred arrangements the conductive elements 46 are powder particles, while in alternate arrangements the conductive elements 46 can comprise larger loose elements, such as fibers, pieces, flakes, pellets, spheres, or rings, etc. The chemical catalyst industry uses elements having similar geometry (beads, pellets, spheres, rings, etc), each being coated with a catalytic material, which would also provide appropriate geometric unit configurations in order to practice alternate arrangements of the present invention. These units or elements 46 can include both porous and nonporous structures. Preferably, these loose elements 46 are arranged so as to maximize the total amount of thermally conductive surfaces in contact with precursor 32. In certain preferred embodiments the elements 46 are formed from an inert, thermally conductive material, such as a ceramic, e.g., SiC. The shapes and materials from which these elements 46 can be formed is discussed in greater detail below.

In an alternate embodiment, a plurality of conductive elements 46 are interspersed with a batch of precursor to form a mixture. Preferably, the inclusion of heat transmitting solid forms collectively increases the thermal conductivity of the batch of precursor.

Figure 7:
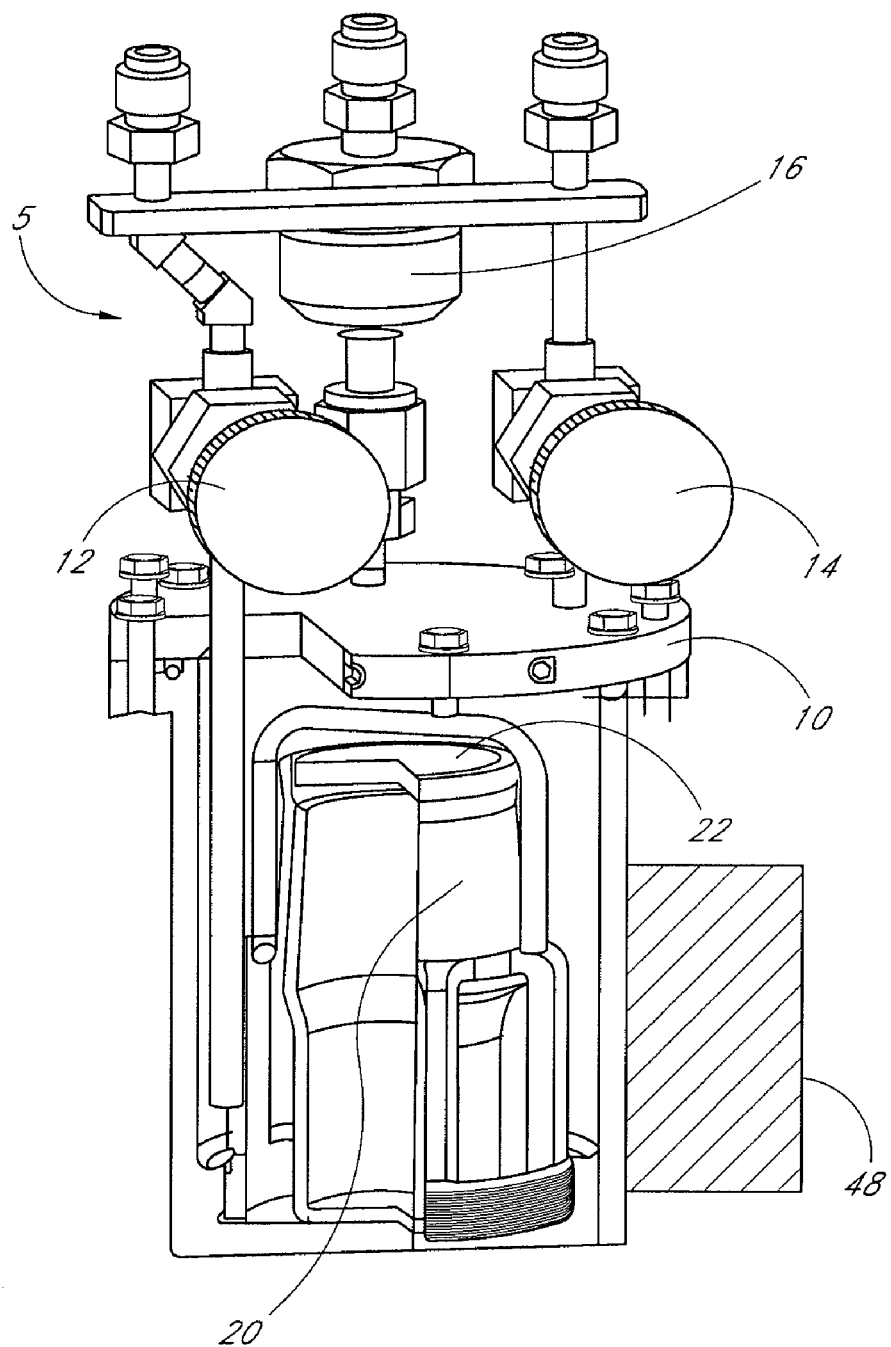
FIG. 7 is a schematic, partially cut-away perspective view of a precursor source apparatus having an adjacent microwave unit, in accordance with an embodiment of the present invention.

Referring to FIG. 7, another embodiment of the present invention is shown employing an energy emitter 48 adjacent to the crucible 20. SiC or another inert, energy-absorbing material (not shown) is placed in the precursor vessel, preferably in the illustrated vessel or crucible 20 along with precursor material, so that the precursor (not shown) is in close contact with the energy absorbing material. In one arrangement, the precursor vessel is also preferably transparent to the emitted energy. The wavelength of the emitted energy is preferably in the microwave range, although alternate arrangements of the embodiments disclosed herein employ other wavelengths of emitted energy.

In a preferred operation, microwaves heat the microwave-absorbing material and heat flows from the heated material, which can be in accordance with FIGS. 4 and 5 or 6, to the precursor. In other arrangements, a crucible is employed inside a vessel, the crucible itself absorbing microwave energy, thereby transmitting heat from the walls of the crucible to the precursor. Generally precursors that are normally used for the deposition of thin films do not absorb microwaves and, thus, cannot be directly heated with microwaves. However, substances such as SiC absorb microwaves, allowing SiC to heat up rapidly, thereby effectuating the desired uniform heating of the precursor. Similarly, other combinations of energy-absorbing material and energy sources operating at different wavelengths will be appreciated in view of the present disclosure. In still another arrangement, when the precursor material is capable of directly absorbing electromagnetic energy like microwaves, direct heating of the precursor material is sufficient to effectuate the desired precursor vaporization, such that separate microwave absorbing material can be omitted.

In alternate arrangements of the aforementioned embodiments, it should be understood that it is also possible to omit the inert crucible and load the precursor directly into the bottom of the pressure chamber 10; preferably, the pressure chamber 10 surfaces in contact with the precursor are sufficiently inert. A particle filter is also preferably placed on top of the precursor powder or, in an alternate embodiment, in the conduit (not shown in figures) between the precursor source and reaction chamber. In embodiments in which a crucible is employed, the crucible can be formed to have porous walls to serve as a filter, thereby reducing the need for a separate particle filter. In accordance with one preferred embodiment, heat conducting material is then mixed with the precursor, while in another preferred embodiment a machined insert is placed into the chamber prior to, during, or after loading of the precursor into the chamber.

Size and Shape of the Inert Heat Conducting Material

Heat conducting material or thermally conductive elements can be used in different shapes, e.g., powders, fibers, irregular pieces and machined pieces.

The grain size of inert powders is selected according to the application, as would be appreciated by the skilled artisan. Precursor source vessels that do not include any particle filters should preferably be filled with conductive, inert elements (e.g., SiC powder) that are coarse enough to prevent the dusting of the material. Precursor source vessels equipped with a filter can be filled with a wide range of conductor particle size; preferably the smallest particles are stopped by the particle filter. One benefit of using small inert, conductive particles is that very small voids in the precursor powder can be filled and the packing density and the heat conductivity through the precursor volume is increased. One goal of certain preferred embodiments is to provide uniform and high heat conductivity through the precursor powder.

In accordance with a preferred embodiment, the mixture of conductive elements and precursor has a heat conductivity lower than that of pure conductor material and higher than that of pure precursor. For example, inert heat conducting material is added to the solid precursor forming a solid mixture, so that there is preferably about 10-80% by volume of heat conducting material in the precursor/conductor mixture and, more preferably, about 30-60% by volume of heat conducting material in the mixture. Re-use of the conductor, although possible, is a challenge, especially when the particle size of the conductor is very small.

In another embodiment, fibers of inert, conductive material, such as carbides or carbon, are employed. Fibers preferably conduct heat efficiently along the fibers through the precursor volume and, also, donate heat to the precursor that is located near the fibers. The fibers are preferably cut into pieces that have a length of about 1-20 mm and are mixed with the aforementioned precursor. For example, suitable SiC fibers are sold, e.g., by Reade Advanced Materials, USA. The heat conducting fibers selected preferably distribute heat from the heater or the precursor vessel walls to the precursor.

In accordance with yet another embodiment, machined pieces of inert, conductive material are used, thereby preferably allowing certain benefits. By employing larger machined pieces, recovery of heat conducting material is relatively easy after use. In addition, the heat conducting material can be cleaned and reused many times. Accordingly, very high purity and expensive heat conducting material can be used economically. Machined pieces can take the form of, for example, rods and plates (as illustrated in FIGS. 4 and 5), or combinations of those shapes and a variety of other shapes, including, for example, screens mounted at various levels along the length of rods or other extensions.

One embodiment employs a combination of machined pieces and smaller heat conducting pieces. Machined pieces preferably effectuate long-distance heat transport from the heater or heated walls of the precursor vessel deep into the precursor volume, while loose heat conducting units (e.g., beads, powder, fibers, etc.) are preferably mixed with the precursor to effectuate the local distribution of heat to the precursor. In one arrangement, heat conducting material in the form of powder is employed in combination with heat conducting material in the form of fibers. In another arrangement, rods are employed in conjunction with a powdered heat conducting material. In view of the disclosure contained herein, the skilled artisan will readily recognize other combinations of heat conducting material forms and materials that would also be advantageous.

In selecting the added inert material that is used according to the present invention, good thermal conductivity is desirable. Inert materials for this purpose preferably have a thermal conductivity of at least about 50 W/m*K, more preferably at least about 80 W/m*K, for the applications presented in this patent application at room temperature, and most preferably have such high conductivity under the conditions of use.

Silicon Carbide

Silicon carbide (SiC) is employed in certain preferred embodiments to form the inert material which is added to the crucible or vessel. SiC is an extremely hard material that has high thermal conductivity, negligible vapor pressure and very good resistance against chemicals at elevated temperatures. According to Performance Materials, Inc., USA, the thermal conductivity of SiC is 250 W/m*K at room temperature and about 120 W/m*K at 400° C. A wide range of SiC grades with different purities are commercially available. The color of silicon carbide (SiC) is known to correlate with its purity. According to Reade Advanced Materials, USA, black SiC has a purity of up to about 99.2%, dark green SiC has a purity of about 99.5% and the purity of light green SiC is about 99.7%. SiC is available in the form of powder, grit, crystals, granules, wafers, fibers, platelets, bars and arbitrary form pieces. Typical impurities in SiC that is produced from silica sand and coke are $SiO_2$, elemental Si, free C, and $Fe_2O_3$. Preferably, such impurities are minimized to decrease potential contamination of the process employing the precursor. Accordingly, in a preferred embodiment, the inert conductive material is preferably greater than 99% pure.

A number of commercial sources of high purity SiC exist. For example, SiC of 99% purity is available from Atlantic Equipment Engineers, USA, in all grit sizes. Poco Graphite, Inc., USA, also produces very high purity SiC with a Chemical Vapour Infiltration (CVI) method where pure graphite is contacted with silicon monoxide (SiO) vapor (Eq. 1). The amount of impurities in SiC is in the ppm level.

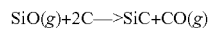

$$SiO(g)+2C \longrightarrow SiC+CO(g) \quad \text{Eq. 1}$$

Cerac, Inc., USA, sells vacuum deposition grade (99.5%) SiC pieces that have dimensions in the range of 3-12 mm.

Other Materials

A number of other suitable inert carbides are commercially available. The thermal conductivity of transition metal carbides is typically about 50% lower than the thermal conductivity of SiC; the conductivity of transitions metal carbides will often be sufficient to provide improved sublimation. Atlantic Equipment Engineers, USA, sells powders of tungsten carbide (WC), vanadium carbide (VC), tantalum carbide (TaC), zirconium carbide (ZrC), hafnium carbide (HfC), molybdenum carbide (MoC), niobium carbide (NbC) and titanium carbide (TiC). The purity of the carbide powder is typically 99.8-99.9%. Such metal carbides may also have useful metal-carbon stoichiometries other than 1:1.

In addition, alternate carbides, such as boron carbides (e.g., $B_4C$) that have sufficiently high thermal conductivity can also be employed; boron carbides are preferably not used for applications that are sensitive to boron impurities.

Another suitably inert and conductive material is Poco-Foam™, manufactured by Poco Graphite, USA, which is very light carbon foam and has a thermal conductivity in the 100 to 150 W/m*K range.

Coated Materials

In selecting a material from which to form the heat conducting material, it is undesirable to utilize materials that have high heat conductivity but have a property that, unmodified, prevents the direct use of the material in solid precursor vessels. For example, a potential material may have a desirable thermal conductivity, but the material reacts with the precursor during processing, i.e., during sublimation. Therefore, the material which is chosen to directly contact the precursor is preferably inert. Certain preferred embodiments allow the use of material that if used alone would be undesirable, by coating a non-inert material having a high thermal conductivity with an inert substance. For example, both graphite and silicon are good conductors of heat. Graphite is very soft and easily forms solid particles that may contaminate substrates in a reaction chamber. A hard inert coating is thus preferably formed on the graphite surface to decrease the number of particles released from the graphite. Similarly, silicon is an efficient reducing agent if the native oxide on the silicon surface is broken. An inert coating deposited on the silicon surface preferably prevents the reactions between the silicon and precursors.

In particular, graphite or silicon can, in certain preferred embodiments, be coated with SiC. Other suitable coating materials are boron carbides, niobium carbide (NbC), tantalum carbide (TaC), titanium carbide (TiC), tungsten carbide (WC), zirconium carbide (ZrC), molybdenum carbide (MoC), vanadium carbide (VC) and hafnium carbide (HfC). Such metal carbides may also have useful stoichiometries other than 1:1. In one embodiment, insufficiently pure carbides are preferably coated with a thin, high-purity CVD carbide film that prevents the contamination of the precursor in the precursor vessel. In this embodiment, impurities of the CVD carbide coatings are in the parts per million (ppm) range and, thus, do not significantly contaminate precursors or substrates. Transition metal nitrides, such as niobium nitride (NbN), tantalum nitride (TaN), titanium nitride (TiN), tungsten nitride (WN), zirconium nitride (ZrN), molybdenum nitride (MoN), vanadium nitride (VN) and hafnium nitride (HfN), serve as further examples of suitable inert coatings on heat conducting materials. In addition, in one embodiment, silicon nitride is formed on the silicon surface and, thus, silicon parts and pieces are passivated.

The following examples, including the methods performed and results achieved are provided for illustrative purposes only and are not to be construed as limiting upon the present invention.

EXAMPLES

Example 1

A Pulsar® 3000 ALCVD™ reactor, available commercially from ASM International, N.V. of Bilthoven, The Netherlands, was used for the deposition of $HfO_2$ from alternating pulses of $HfCl_4$ and $H_2O$ via sequential, self-saturating surface reactions. The $HfCl_4$ vapor for those pulses was provided from a solid source. A mixture of 157.6 g of $HfCl_4$ and 200.8 g of 99.5% SiC (obtained from Orkla Exolon, Norway) was loaded into a source container. In the mixture there was approximately 100 $cm^3$ of each precursor. Thus, the mixture of precursor material and conductive elements was a 1:1 volumetric mixture.

As a result, the source temperature could be lowered from 200-205° C. (no carbide fill) to 180° C. (with carbide fill). It is believed that the recovery rate (i.e., time after pulsing that sufficient vapor develops for the next pulse) of the source improved because of the increased and more stable sublimation rate of the precursor. The deposition of thin films from the same precursor batch was made possible for a longer time than without the carbide fill. The addition of SiC improved the $HfO_2$ thin film thickness uniformity on the substrates. Use of SiC conductive filler did not affect the number of particles on wafers.

Example 2

$ZrCl_4$ powder was mixed with boron carbide ($B_4C$) powder in a glove box. The mixture was loaded into a source boat made of glass. The source boat with the mixture was then placed in a glass tube to serve as a carrier tube. Ends of the tube were covered with Parafilm to prevent the exposure of $ZrCl_4$ to room air and moisture. The tube was carried from the glove box to an F120 ALD reactor from ASM International N.V., and the source boat was moved from the carrier tube to a source tube (pressure vessel) of the reactor while inert nitrogen gas was flowing out of the source tube. After the loading of the source boat was completed and substrates were placed into the reaction chamber of the reactor, the reactor was evacuated to vacuum with a mechanical vacuum pump. Pressure of the reactor was adjusted to about 3-10 mbar with flowing inert nitrogen gas. The reaction chamber was heated to the deposition temperature and the $ZrCl_4$ reactant zone of the reactor was heated also to the sublimation temperature. $ZrO_2$ thin film was deposited from sequential alternating pulses of $ZrCl_4$ and $H_2O$ vapor. It was found that the sublimation rate of $ZrCl_4$ increased clearly when boron carbide had been mixed with $ZrCl_4$. Boron carbide helped to transport heat energy through the precursor volume.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

We claim:

1. A method of producing a vapor from a solid precursor for processing a substrate, comprising:
   placing independent solid units of precursor into a vessel;
   interspersing a plurality of independent units of thermally conductive material with the units of precursor, the plurality of independent units comprising a plurality of rods, wherein interspersing comprises inserting the plurality of rods into the vessel, wherein each independent unit of thermally conductive material is surrounded by the units of precursor, the units of precursor being separate and independent of the units of thermally conductive material;
   feeding a carrier gas into the vessel through an inlet of the vessel;
   forming a vapor through applying energy from a separate energy source to both the thermally conductive material and the solid units of precursor; and
   transporting the vapor from an outlet of the vessel to a reaction chamber with said carrier gas.

2. The method of claim 1, further comprising reacting the vapor to deposit a layer on a substrate.

3. The method of claim 2, wherein reacting the vapor to deposit the layer comprises atomic layer deposition (ALD).

4. The method of claim 2, wherein reacting the vapor to deposit the layer comprises chemical vapor deposition (CVD).

5. The method of claim 1, wherein inserting the rods comprises inserting a base plate into the vessel, wherein the rods are attached to the base plate.

6. The method of claim 1, wherein inserting the rods comprises inserting the rods independently of one another.

7. The method of claim 1, wherein interspersing the units of thermally conductive material comprises supplying the plurality of rods attached to a base of the vessel.

8. The method of claim 1, wherein applying energy from a separate energy source comprises flowing heat along a primary axis of each rod and then radially outward from each rod to the solid units.

9. The method of claim 1, wherein interspersing comprises providing the units of thermally conductive material with a thermal conductivity of at least about 50 W/M*K at room temperature.

10. The method of claim 1, wherein interspersing comprises providing the units of thermally conductive material with a thermal conductivity of at least about 80 W/M*K at room temperature.

11. The method of claim 1, wherein applying energy from a separate energy source comprises transmitting microwave energy from outside the vessel.

12. The method of claim 11, wherein applying energy from a separate energy source comprises absorbing the microwave energy in the thermally conductive material and transmitting the energy as heat to the solid units of precursor.

13. The method of claim 1, wherein interspersing comprises providing the plurality of rods, wherein the rods are machined and attached to a base of the vessel.

14. The method of claim 1, wherein inserting the rods comprises providing the thermally conductive material comprising stainless steel.

15. The method of claim 1, wherein inserting the rods comprises providing the thermally conductive material comprising silicon carbide-coated graphite.

16. The method of claim 1, wherein inserting the rods comprises providing substantially cylindrical rods.

17. The method of claim 1, wherein inserting the rods comprises providing elongated rods.

18. The method of claim 1, wherein inserting the rods comprises providing substantially straight rods.

19. The method of claim 1, wherein inserting the rods comprises providing screens mounted at various levels along lengths of the rods.

* * * * *